United States Patent [19]

Kaji et al.

[11] Patent Number: 4,873,070
[45] Date of Patent: Oct. 10, 1989

[54] PROCESS FOR PRODUCING SILICON CARBIDE WHISKERS

[75] Inventors: Kichiro Kaji; Katsunori Shimasaki, both of Kobe; Masakazu Yamamoto, Ikeda; Kozo Saiki; Keita Yura, both of Kobe; Hidetsugu Habata, Osaka; Isao Kimura, Suita; Tetsuo Suzuki, Kobe, all of Japan

[73] Assignee: Kabushiki Kaisha Kobe Seiko Sho, Kobe, Japan

[21] Appl. No.: 96,473

[22] Filed: Sep. 15, 1987

[30] Foreign Application Priority Data

Dec. 20, 1986 [JP] Japan ................. 61-305123
Dec. 20, 1986 [JP] Japan ................. 61-305122
Dec. 27, 1986 [JP] Japan ................. 61-301970

[51] Int. Cl.$^4$ .............................. C01B 31/36
[52] U.S. Cl. .................................... 423/345
[58] Field of Search ........................ 423/345

[56] References Cited

FOREIGN PATENT DOCUMENTS

| 7009207 | 3/1977 | Japan | 423/345 |
| 6100125 | 8/1981 | Japan | 423/345 |
| 0045198 | 3/1983 | Japan | 423/345 |
| 0120599 | 7/1983 | Japan | 423/345 |
| 0016809 | 1/1985 | Japan | 423/345 |

*Primary Examiner*—John Doll
*Assistant Examiner*—Lori S. Freeman
*Attorney, Agent, or Firm*—Oblon, Spivak, McClelland, Maier & Neustadt

[57] ABSTRACT

A process for producing silicon carbide whiskers by heating a react solid silicon-containing starting material and carbon-containing starting material in a reaction vessel, wherein a molding material, which is prepared by previously molding the silicon-cotaining starting material into a predetermined shape, and a powdery carbon starting material are heated to a predetermined reaction temperature under a hydrogen gas atmosphere. Silicon carbide whiskers which are linear with no bendings, long fiber length, high aspect ratio and low silicon dioxide impurity can be obtained at a high yield of greater than 90% based on silicon vaporized from the silicon-containing starting material.

12 Claims, 1 Drawing Sheet

PROCESS FOR PRODUCING SILICON CARBIDE WHISKERS

BACKGROUND OF THE INVENTION

1. Field of the Invention

This invention concerns a process for producing silicon carbide whiskers, and more specifically, it relates to a process for producing silicon carbide whiskers which are linear, of high aspect and high purity at a high yield.

2. Description of the Prior Art

Silicon carbide whiskers have been used in various application uses, and for example, in the case of using them as various reinforcing materials by utilizing their strength, it is required that the fiber length is long and the aspect ratio defined as a ratio of the length relative to the cross sectional diameter of the fiber is high.

As a typical process for producing silicon carbide whiskers, there has been known, for example, a method of uniformly mixing powdery silicon-containing starting material and carbon-containing starting material and reacting them under heating at a high temperature as described, for example, in Japanese Patent Application Laying Open No. Sho 58-14570. Further, for intensely mixing the starting material as described above, it has also been proposed a method of mixing to mold a powdery silicon-containing starting material and a carbon-containing starting material and then heating them, for example, in Japanese Patent Application Laying Open No. Sho-58-20799.

However, in such prior art methods, it has been difficult to obtain silicon carbide whiskers of long fiber length and high aspect ratio, and in addition, the resultant silicon carbide whiskers are generally of low purity containing unreacted silicon-containing starting material such as silica or the like and purifying treatment such as using fluoric acid or the like is necessary before use.

Further, it is not easy in the former method to separate the thus formed silicon carbide whiskers from the starting material. In addition, in the case of preparing silicon carbide whiskers through the heating reaction of a solid-like silicon-containing starting material and a carbon-containing starting material, since impurities contained in the starting materials are generally dispersed uniformly and contained in the resultant whiskers, if such impurities are contained in a great amount, they have to be separated and removed. While on the other hand, if it is intended to save the separating and removing step for the impurity, it is necessary to limit the impurity content in the starting material to less than a certain level.

In order to overcome the foregoing problems, the present inventors have already proposed a process of bringing the silicon-containing material and the carbon-containing material into contact and reaction at a temperature higher than 1,000° C. wherein a metal chloride typically represented by sodium chloride to be present together (refer to Japanese Patent Publication No. 58-28758), or a process of mixing and introducing hydrogen chloride or chlorine to a mixture of a finely powderous silicon starting material, a carbon starting material and a catalyst under a non-oxidizing atmosphere and bringing into reaction at a temperature from 1,350° C. to 1,600° C. (refer to Japanese Patent Application Laying Open No. Sho 58-251964), but they have not been quite satisfactory in view of the yield, the aspect ratio, etc.

SUMMARY OF THE INVENTION

In view of the above, present inventors has further made an earnest study on the production of silicon carbide whiskers, and as a result, have achieved the present invention on the finding that when a powdery silicon-containing starting material is previously molded into a predetermined shape and heated to a high temperature together with a powdery carbon-containing starting material under the presence of a hydrogen gas, the silicon compound is selectively gasified and brought into reaction with carbon to thereby obtain silicon carbide whiskers which are linear with no bendings, have a long fiber length, a high aspect ratio and an extremely high purity at high yield and high productivity.

Accordingly, it is an object of the present invention to provide a process for producing silicon carbide whiskers which are linear with no bendings, have a long fiber length, a high aspect ratio and a high purity, at a high yield.

The foregoing object of the present invention can be attained by a process of producing silicon carbide whiskers by heating to react a solid silicon-containing starting material and a carbon-containing starting material to each other in a reaction vessel, wherein a molding product prepared by previously molding the silicon-containing starting material into a predetermined shape and a powdery carbon starting material are heated to a predetermined reaction temperature under a hydrogen gas atmosphere.

The molding product comprising the silicon-containing starting material in the present invention includes those three dimensional solid materials provided with a shape of plate, bar, tube, cylinder, sphere, wire, granule or the combination of them by molding the starting material with adequate means, for example, extrusion molding, press molding and pelletization.

Generally, in a process for producing silicon carbide whiskers by heating to react a solid silicon-containing starting material and a carbon-containing starting material, these starting materials are charged in a reaction vessel which is inserted into a tubular reactor equipped with heating means, for example, an electrical furnace and heated to a predetermined temperature.

In the process according to the present invention, the molding product comprising a silicon-containing starting material as described above can also serve as a reaction vessel such as a tubular or box-like vessel for charging the starting powdery carbon material.

Thus, in the process according to the present invention, when the solid silicon-containing starting material is used in the form of its molding product, since a silicon compound is selectively gasified from the molding product and brought into reaction with carbon to form silicon carbide whiskers, silicon carbide whiskers at high purity with less than several percentage of impurity content can be obtained even when a solid silicon-containing starting material with low silicon or silicon oxide content is used. Further, since the resultant silicon carbide whiskers can be separated from the molding product extremely easily, their productivity is high.

The silicon-containing molding product used herein preferably contains more than 30% by weight of silicon dioxide. It is more preferable that the balance contains metal silicon. Particularly, in the case of the latter, the silicon dioxide powder and the metal silicon powder are mixed and molded while setting the mixing molar ratio from 0.5:1 to 10:1. Upon molding, both of the starting materials may be molded as they are, but molding with the addition of an organic binder can provide a favorable result.

Typical example of the organic binder can include water-soluble polymer or organic solvent-soluble polymer such as PVA, CMC, HEC, methylcellulose, hydroxy propyl cellulose and PEG which may be used alone or in combination.

Carbon black or powdery activated carbon, etc. may be used as the powdery carbon-containing starting material. Since these starting carbon materials have higher reactivity as they are finer and have greater bulk volume, carbon black with the BET specific surface area of greater than 100 m$^2$/g, average grain size of less than 35 nm and the bulk density from 0.06 to 0.2 g/cm$^3$ is particularly preferred.

In the process according to the present invention, use of a reaction catalyst is desirable. As the reaction catalyst, iron, nickel, cobalt or a compound thereof, for example, oxide, nitrate, chloride, sulfate or carbonate is used in the form of powder or aqueous solution in admixture with the carbon starting material. A nickel compound is a catalyst which can be used particularly preferably in the present invention.

Further, in the process according to the present invention, it is preferred to use a reaction promoter in order to accelerate the reaction, as well as obtain silicon carbide whiskers of high purity, high aspect ratio, and further, low bulk density. As such a reaction promoter, alkali metal or alkaline earth metal halide, particularly, chloride or fluoride can be used preferably. Accordingly, the specific example thereof can include, for example, lithium chloride, sodium chloride, potassium chloride, calcium chloride, magnesium chloride, lithium fluoride, sodium fluoride and potassium fluoride. Most preferred reaction promoters among them are sodium chloride, potassium chloride, sodium fluoride and potassium fluoride.

The present inventors have already proposed, in Japanese Application Laying Open No. Sho 58-251964 cited previously, a process for introducing hydrogen chloride or chlorine from the outside of the reaction system instead of the reaction promoter, for example, sodium chloride upon producing silicon carbide whiskers by the heating reaction of the silicon-containing starting material and the carbon-containing starting material. However, in the process according to the present invention, since a molding product comprising a silicon-containing starting material and a carbon-containing starting material are heated in a hydrogen atmosphere under the presence of reaction promoter thereby generating the hydrogen halide from the reaction promoter in the reaction system and gasifying the silicon compound selectively from the molding product, which is reacted with a carbon, it is possibly to obtain silicon carbide whiskers at high purity and having long fiber length and high aspect ratio at high yield. Therefore, according to the present invention, it is no more necessary to use those gases such as hydrogen chloride or chlorine which are corrosive and difficult to handle with as the starting material gas.

Then, in the case of using a powder as the silicon-containing starting material, since there are extremely many portions in contact with the carbon-containing starting material as can be seen easily, the silicon carbide whisker-forming reaction proceeds in a state substantially equal with the solid phase reaction, and as a result, the whiskers take a powdery form or a linear shape with many bendings. However, in the case of using a molding product of a silicon-containing starting material in accordance with the present invention, since the portions in contact with the carbon-containing starting material is remarkably reduced, silicon monoxide which is a reduction form of silica is predominantly resulted as a gas phase, and accordingly, it is considered that linear silicon carbide whiskers with no bendings are formed. It should, however, be noted that the present invention is no way suffer from the restriction by the aforementioned theory.

Referring more specifically to the case of using sodium chloride as the reaction promoter, since sodium chloride has a melting point at 800° C. and a boiling point at 1,413° C. under a normal pressure, it has already been gasified under the reaction condition in the process according to the present invention, and an atmosphere where sodium chloride vapors occupy a high vapor pressure is formed within the reaction system. Sodium chloride does not cause any chemical change but merely forms the sodium chloride vapors if heated to a high temperature, for example, to 1,500° C. in hydrogen or like other non-oxidating atmosphere even if substance such as platinum or graphite is present together. However, in the case of heating sodium chloride to a predetermined temperature together with the molding product containing the silicon-containing starting material under a hydrogen gas atmosphere as a carrier gas, a sodium chloride is thermally decomposed to evolve hydrogen chloride continuously within a reaction system. While on the other hand, in the case of using non-oxidating gas other than hydrogen gas as the carrier gas, for example, argon, helium, nitrogen or like other gas, no evolution of hydrogen chloride is observed. Further, the hydrogen gas atmosphere referred to in the present invention can include not only the hydrogen gas but also such an atmosphere as containing hydrogen by greater than 70 volume percent and the balance of the non-oxidative inert gas.

That is, when the catalyst and the reaction promoter are mixed with the molding product of the silicon-containing starting material and the powdery carbon-containing starting material and heated under a non-oxidative atmosphere, although the evolution of hydrogen chloride is not observed even if it is heated up to 1,500° C., for example, in a nitrogen atmosphere, hydrogen chloride is gradually evolved after sodium chloride has been melted in a hydrogen atmosphere, the evolution amount is gradually increased as the temperature goes higher than 1,000° C. and the amount of the hydrogen chloride formed reaches its maximum at 1,400°-1,600° C.

Accordingly in the case of conducting the process of the present invention by the batchwise reaction, non-oxidative inert gas other than the hydrogen, for example, argon, helium, nitrogen, etc. may be used to flow in the reaction system as a carrier gas till the temperature reaches a predetermined reaction temperature and then the carrier gas can be switched to a hydrogen gas after a predetermined reaction temperature has been reached. While on the other hand, in the case of conducting the process according to the present invention in a continuous reaction system, the hydrogen gas is always introduced into the reaction system and hydrogen halide from the reaction promoter is formed.

The catalyst is used in the process according to the present invention in an amount ranging usually from $5 \times 10^{-6}$ to $5 \times 10^{31\ 3}$ g, preferably, from $1 \times 10^{-5}$ to $1 \times 10^{-3}$ g per unit surface area (cm$^2$) of the molding product of the silicon-containing starting material. If the amount of the catalyst is less than $5 \times 10^{-6}$ g per unit surface area (cm$^2$) of the molding product of the silicon-containing starting material, the catalytic effect is insufficient, and as a result, formation of the silicon carbide whiskers is insufficient and unreacted silicon-containing starting material remains in a great amount even after the reaction under a predetermined condition. While on the other hand, if the amount is more than $5 \times 10^{-3}$ g, the catalyst powder remains as it is in the resultant whiskers tending to complicate the purifying treatment for the silicon carbide whiskers produced.

The alkali metal or alkaline earth metal halide for use as the reaction promoter is used within a range usually from $5 \times 10^{-4}$ to $5 \times 10^{-1}$ g, preferably, from $1 \times 10^{-3}$ to $1 \times 10^{-1}$ g per unit surface area (cm$^2$) of the molding product of the silicon-containing starting material. If the amount is less than $5 \times 10^{-4}$ per unit surface area (cm$^2$) of the silicon-containing starting material molding product, since only a slight amount of the hydrogen halide is generated by the decomposition of the halogenated compound, it lacks in the improvement for the yield of the silicon carbide whiskers and is poor in the improvement for the shape thereof. While on the other hand, use of a greater amount than $5 \times 10^{-1}$ g is not desirable since evolution of the hydrogen halide due to the decomposition is locally concentrated and the gaseous silicon compound resulted from the molding product is tended to be released as it is out of the system to rather decrease the amount of the silicon carbide whiskers.

In the process according to the present invention, the silicon dioxide-containing molding product and the solid carbon-containing starting material are heated in a hydrogen gas atmosphere to a predetermined temperature, for example, in a restricted space such as of an electric furnace thereby obtaining silicon carbide whiskers, whereby the silicon carbide whiskers can be obtained at a remarkably high yield by maintaining the concentration of the hydrogen gas as the hydrogen gas atmosphere always higher than 70%. For instance, in the case where the reaction furnace comprises a plurality of regions containing a reaction region for heating to react the silicon dioxide molding product and the solid carbon-containing starting material, the restricted space in the present invention means such reaction regions and at least the regions in the reaction furnace may be maintained to such an atmosphere containing more than 70% of hydrogen concentration.

In the process according to the present invention, it is considered that the silicon carbide whiskers are formed by the following reaction, although the present invention is no way restricted to such reaction mechanisms:

$$C + 2H_2 \rightarrow CH_4 \quad (1)$$

$$SiO_2 + CH_4 \rightarrow SiO + 2H_2 \quad (2)$$

$$SiO + 2CH_4 \rightarrow SiC + CO + 4H_2 \quad (3)$$

That is, the hydrogen gas and the solid carbon starting material at first form a methane gas in accordance with the reaction (1), and the gas forms a silicon monoxide gas at the surface of the silicon dioxide-containing molding product in accordance with the reaction (2).

Then, silicon carbide is formed through the reaction (3) between the silicon monoxide gas and the methane gas. Accordingly, the overall reaction can collectively be represented as:

$$SiO_2 + 3C \rightarrow SiC + 2CO \quad (4)$$

In the reaction (4) above, although hydrogen does not contribute to the formation of silicon carbide, hydrogen is indispensable in the course of the reaction as can be seen from the reactions (1)-(3), and further, since the hydrogen gas being small molecule easily diffuses into the reaction vessel to facilitate the reduction of silicon dioxide into silicon monoxide by methanation of carbon, it contributes to the increase in the yield of the silicon carbide whiskers. Moreover, in the process according to the present invention, it is considered that since the silicon carbide whiskers are formed finally through the gas reaction as shown by the reactions (1)-(3), they are excellent in the acicular property.

As has been described above in the foregoing reaction, the hydrogen gas makes an important contribution to the formation of the silicon carbide whiskers and the yield of the silicon carbide whiskers can significantly be improved and the acicular property thereof can also be improved remarkably by maintaining the hydrogen gas as the atmosphere in the reaction region so as always to higher than 70%. For keeping the atmosphere in the reaction region to always contain hydrogen gas of higher than 70%, a great amount of hydrogen is caused to flow into a reaction furnace thereby preventing the lowering in the hydrogen concentration along with the formation of by-produced carbon monoxide as described above. When a molding product, which is prepared by mixing a metal silicon powder and a silicon dioxide powder at a predetermined ratio and then molding them into a predetermined shape with addition of an organic binder, is charged into a vessel made of graphite in a state where the powdery carbon starting material is present at the periphery thereof and heated while flowing a hydrogen gas, the metal silicon and the silicon dioxide are heated to a high temperature under a reducing atmosphere to evolve silicon monoxide in a gaseous form, which is then brought into a gas phase reaction with the surrounding carbon starting material thereby obtaining silicon carbide whiskers of high purity with no bendings and branches having a high aspect ratio and composed of acicular crystals at a high yield and high productivity.

Both of the powders are preferably mixed and used at a molar ratio of SiO$_2$/Si from 0.5/1 to 10/1 based on SiO$_2$ and Si in the powders. The most preferred ratio is from 2/1 to 8/1. If the ratio is less than 0.5/1 and the amount of the SiO$_2$ ingredient is decreased, the molding product of the starting material softens to lose the initial shape under the temperature condition upon reaction tending to cause troubles in view of maintaining the shape of the molding product. Further, since the amount of rapidly reacting Si ingredient is relatively increased, the amount of silicon monoxide evolved is increased temporarily to render the starting material gas concentration higher to thereby disturb the shape of the resultant whiskers thereby often causing bending or branching. While on the other hand, if the ratio of the SiO$_2$ ingredient increases in excess of 10/1, since the slow reacting SiO$_2$ ingredient is relatively increased, the amount of the silicon monoxide evolved is decreased tending to reduce the amount of the whiskers produced, that is, lowering in the productivity under the identical reaction conditions.

Accordingly, it is desirable that both of the starting materials as described above are mixed and used at the $SiO_2/Si$ molar ratio within a range from 0.5/1 to 10/1.

In the present invention, both of the starting materials are mixed in the powdery state into a predetermined shape. Upon molding, while both of the starting materials may be molded as they are, molding with an addition of an organic binder can provide a satisfactory result.

As a typical example of the organic binder, there can be mentioned water-soluble polymer or organic solvent-soluble polymer such as PVA, CMC, HEC, methyl cellulose, hydroxy propylcellulose and PEG which may be used alone or in combination.

In the process according to the present invention, the reaction temperature is at least higher than 1,400° C., and usually, it is preferably from 1,500° to 1,700° C. If the reaction temperature is lower than 1,400° C., formation of silicon carbide whiskers becomes insufficient and a lot of unreacted silicon-containing starting material remains. While on the other hand, if the temperature is excessively high, the effects of improving the yield and reducing the impurity are saturated and it rather causes the increase in their production cost. Accordingly, the upper limit for the reaction temperature is usually at about 1,700° C. While optional heating means may be used, electric heating is easy to be used.

The carrier gas containing the hydrogen gas in the process according to the present invention is introduced into a reaction system at a rate of 0.5–50 ml/min and, preferably, from 1 to 20 ml/min per unit gas flow cross sectional area ($cm^2$) of the reaction device.

The reaction time is from 30 minutes to 10 hours and usually it is sufficient from 2 to 6 hours. If the reaction time is too short, a lot of unreacted starting material remains. While on the other hand, if the reaction is conducted for an excessively long time, since the yield for the silicon carbide whisker increases only slightly, it can provide no particular merit in view of the productivity and the heat energy cost.

However, the present inventors have found, in the case of continuously producing silicon carbide whiskers by the process as described above, vapors containing elements such as sodium, potassium, magnesium, calcium, sulfur, iron and silicon are formed from the furnace material or reaction starting material thereby clogging the exhaust gas piping for the reaction furnace and hindering the continuous production of silicon carbide whiskers for a long period of time. Then, as a result of an earnest study for overcoming such a problems, a heating region for uniformly heating the reaction starting material under a non-oxidative gas atmosphere and a cooling region to the down stream thereof are disposed in a reaction furnace thereby forcedly cooling the reaction product resulted from the heating reaction and the atmosphere in the furnace to deposit and collect vapors by-produced upon heating reaction.

Accordingly, by the process according to the present invention, since the vapors described above are not deposited to adhere the exhaust gas pipe ways, silicon carbide whiskers can be produced stably for a long period of time continuously.

Then, the reaction products are allowed to cool as required, and preferably, excess carbon in the reaction product is oxidized to burn and usually linear silicon carbide whiskers can be obtained.

In the process according to the present invention, silicon carbide whiskers containing silicon dioxide impurity of less than 5% by weight can be obtained by forming silicon carbide whiskers at a predetermined temperature as described above, then recovering the reaction product, heating the product in a furnace at a temperature lower than 1,100° C., preferably, lower than 700° C., to oxidize and burn out the unreacted carbon starting material.

In this way, in the process according to the present invention, silicon carbide whiskers can be obtained generally at a yield higher than 90% based on silicon gasified from the silicon-containing starting material, and further, the silicon carbide whiskers are linear with no bendings, and have long fiber length and high aspect ratio. Furthermore, since the silicon carbide whiskers are of high purity with the content of the silicon dioxide impurity usually of lower than 5%, they can be served for usual application uses with no particular purification. However, if required, they may be applied with a purifying treatment of dipping into fluoric acid, maintaining at a room temperature or heated to 70°–80° C., thereby dissolving and washing out with water the impurities other than silicon carbide.

Further in the process according to the present invention, since the reaction promoter is used, silicon carbide whiskers of high purity can be obtained at a high yield. Further, when comparing the products with respect to the fiber diameter, fiber length and aspect ratio of the whiskers, they were from 0.5 to 1 μm, from 50 to 500 μm and from 100 to 500 respectively in the case of not using the reaction promoter, whereas they were from 0.1 to 0.5 μm, from 50 to 400 μm and from 500 to 800 respectively in the process according to the present invention.

BRIEF DESCRIPTION OF THE ACCOMPANYING DRAWINGS

These and other objects, features, as well as advantages of the present invention will become apparent by the detailed descriptions in conjunction with the accompanying drawings, wherein, FIG. 1 is a front elevational view in cross sectional of a furnace reactor for use in the process according to the present invention; and FIG. 2 is a transversal cross sectional view of the furnace reactor shown in FIG. 1.

DETAILED DESCRIPTION OF THE PREFERRED EMBODIMENTS

Figure 1:
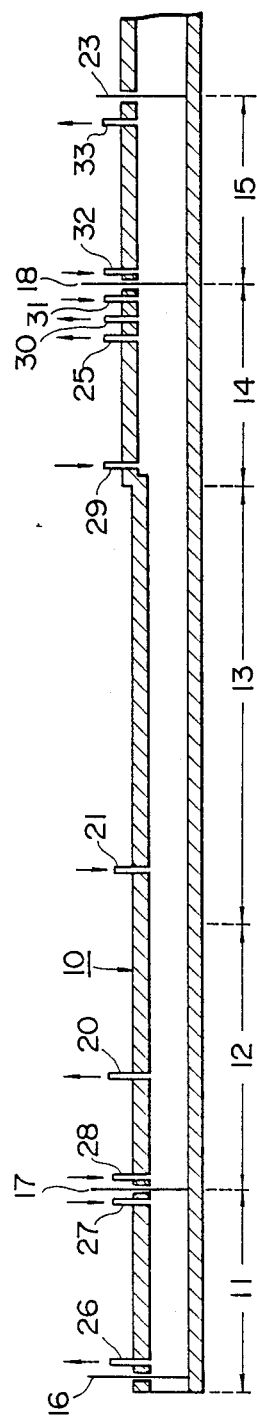
Figure 2:
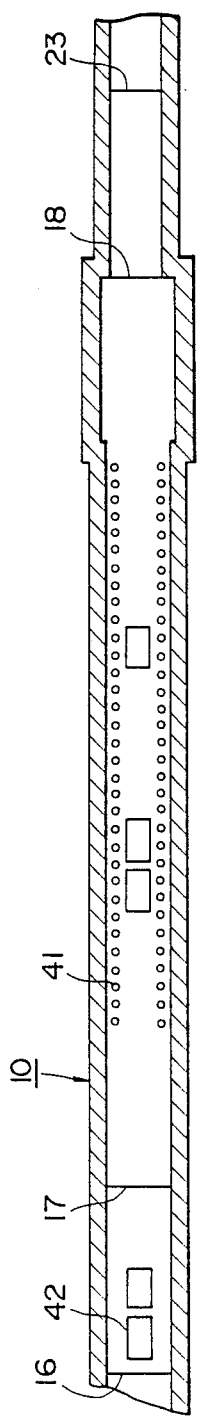

The present invention will now be described while referring to examples and comparative examples but it should be noted that the present invention is no way restricted only to these examples.

EXAMPLE 1

A reaction vessel made of mullite (50% silica and 50% aluminum) substantially of a cylindrical shape having an outer diameter of 25 mm, an inner diameter of 20 mm and a length of 120 mm closed at one end, and equipped with a hydrogen charging port and an exhaust gas exit was used as a silicon dioxide-containing molding product. 2.5 g of carbon black incorporated with 0.5% by weight of ferric oxide was charged in the reaction vessel, which was then inserted into a tubular electric furnace. The temperature of the electric furnace was increased while flowing a hydrogen gas at a rate of 100 ml/min therethrough, and after maintaining the temperature at 1,500° C. for 4 hours, the temperature was lowered. Meanwhile, the hydrogen concentration of the gas from the exhaust gas exit of the electric furnace was 92%.

Then, the reaction vessel was taken out from the electric furnace, silicon carbide whiskers deposited to the inside of the reactor were taken out and unreacted carbon black was burnt and removed to obtain 2.5 g of linear silicon carbide whiskers with no bendings.

EXAMPLE 2

The silicon dioxide-containing molding product and carbon black were heated to react by the same procedures as in Example 1 excepting for charging a gas mixture comprising 80% of hydrogen and 20% of argon to the inside of the electric furnace. In the course of the reaction, the hydrogen concentration of the gas from the exhaust gas exit of the electric furnace was 75%. By the process, 2.0 g of linear silicon carbide whiskers with no bendings were obtained. However, the fiber length was somewhat shorter as compared with the silicon carbide whiskers obtained in Example 1.

COMPARATIVE EXAMPLE 3

Silicon dioxide-containing molding product and carbon black were heated to react by the same procedures as in Example 1 excepting for charging a gas mixture comprising 60% of hydrogen and 40% of argon to the inside of an electric furnace. In the course of the reaction, the hydrogen concentration of the gas from the exhaust gas exit of the electric furnace was 58%. This procedure provided only 0.2 g of silicon carbide whiskers containing powdery material, having finer diameter and the fiber length as short as about 1/10 as compared with that in Example.

COMPARATIVE EXAMPLE 2

Silicon dioxide-containing molding product and carbon black were heated to react in the same procedures as in Example 1 excepting for supplying argon to the inside of an electric furnace. According to this method, since only the carbon black in contact with the reaction vessel concerns the reaction, only 0.1 g of silicon carbide whiskers were obtained. Further, the silicon carbide whiskers were in a powdery or bulky form and they scarcely include the acicular form.

EXAMPLE 3

Quartz powder with an average particle size from 5 to 10 μm and metal silicon powder with an average particle size from 10 to 20 μm were used as the starting material and both of the weighed were metered and mixed such that the $SiO_2/Si$ molar ratio was 4/1. While on the other hand, hydroxy propylcellulose was dissolved in dichloromethane to prepare a viscous solution. Then, the solution containing the solid content corresponding to 5% of the total solid used for the molding was poured into the mixing powder to prepare a paste-like state, which was then air-dried to remove the solvent. Then, the mixture was filled within a die of 7×15×70 mm, subjected to pressure-molding under the room temperature at a pressure of 0.5 t/cm² to obtain a square post-like solid molding product. In the square post-like molding product, 20 g of silicon starting material was contained. The bending strength of the product under the room temperature was 15 kg/cm².

The starting material in the form of the molding product was inserted into a cylinder made of graphite with 40 mm inner diameter, 5 mm wall thickness and 100 mm length, one of the openings of which was closed with a graphite cap and 7.5 g of carbon black (V - XC -72R:manufactured by Cabbot) admixed with 0.093 g of powdery $CoCl_26H_2O$ as a catalyst was inserted to fill the inner space and the opening on the side of the insertion was closed with carbon fiber felts. The thus manufactured reaction vessel was inserted to the central portion of a tubular reactor made of aluminum having 65 mm outer diameter, 60 mm inner diameter and 1,000 mm length, which was further inserted into an electric furnace.

Then after introducing a nitrogen gas for one hour at a flow rate of 5 ml/min per unit cross sectional area (cm²) of the tubular furnace reactor, the temperature was increased at a rate of 5° C./min, and after the temperature at the central portion of the furnace reached 1,000° C., introduction of the nitrogen gas to the electric furnace was interrupted. Then, the temperature at the center in the tube was increased to 1,530° C. while introducing a hydrogen gas into the tubular reactor at a flow rate of 5 ml/min/cm² (tubular reactor cross sectional area) and then maintained at that temperature for 4 hours. Then, the temperature in the furnace was gradually decreased and the introduction of the hydrogen gas interrupted. Then, after switching the furnace atmosphere to the nitrogen gas, content was taken out.

The content taken out from the graphite cylinder was a dark green moss-like lump in which the solid molding product used as the starting material remained in the sintered and shrinked state with a gap from the lump product. For removing the unreacted carbon black from the reaction product, they were sintered for 4 hours in a furnace at an internal temperature of 700° C. to obtain 6.6 g of silicon carbide whiskers. In this case, reduction in the weight of the solid molding product was 9.03 g. Accordingly, the yield for the silicon carbide whiskers based on silicon vaporized from the slid molding product was 95% and silicon dioxide as the impurity content was 5%. The thus obtained silicon carbide whiskers showed a pattern only for β-SiC X-ray diffractiometry, and had an acicular shape with no bending and branches and the fiber diameter, fiber length and aspect ratio were, respectively, from 0.1 to 0.5 μm, from 50 to 400 μm and from 500 to 800. Presence of powdery silicon carbide and other impurities was not recognized at all.

COMPARATIVE EXAMPLE 3

Powdery mixture using identical quartz powder and metal silicon powder in Example 1 was weighed by 20 g in total so as to contain $SiO_2/Si$ molar ratio of 4/1 and inserted and charged into the same cylinder made of graphite as used in Example 1. Then, 7.5 g of carbon black containing the same amount of the catalyst as used in Example 1 was covered over the charged mixed powder and the reaction was proceeded under the same conditions in Example 1 and the content was taken out after cooling the furnace.

The content was dark green moss-like lump, but since it was integrated with the powder mixture used for the starting material at the bottom, most of the starting powdery material was separated by beating. However, they could not be separated completely but some of them were contained to the lump of whiskers. Further, some of fine pseud whiskers approximate in the shape to a powdery form fell together with the separated powder. Then, the content separated from the starting powder was subjected to baking treatment for removing unreacted carbon black in the same furnace as in Example 1 to obtain 5.2 g of silicon carbide whiskers. The content of the silicon dioxide as the impurity was 12%, while the yield of the silicon carbide whiskers was 35% based on 20 g of the starting material used.

The resultant silicon carbide whiskers were remarkably mixed with bending and branches, poor in the simple acicular shape and contained a great amount of powdery obstacles mixed therein. When measuring the fiber diameter, fiber length and aspect ratio for the whiskers approximate in the shape to the acicular form, they were 1-3 μm, 10-39 μm and 10-50 respectively.

EXAMPLE 4

Four molding plates each of 120 mm length, 40 mm width and 80 mm height were disposed at an equivalent distance containing 95% by weight of silicon dioxide were disposed in a box-like reaction vessel made of highly pure carbon with the inner longitudinal and lateral size each of 130 mm and the depth of 50 mm. Then a uniform mixture comprising 40 g of carbon black having various properties shown in Table 1 and 0.28 g of nickel oxide as a catalyst was charged to the gap in the reaction vessel.

The reaction vessel was capped with a lid made of highly pure carbon at the upper opening thereof and inserted into a reaction furnace. Then, the temperature was increased under a hydrogen gas atmosphere from the room temperature to 1,530° C. for 6 hours, maintained at that temperature for 4 hours and allowed to cool to the room temperature. After removing the molding plates as the reaction residue from the reaction vessel, the contents were collected and burnt in air at a temperature of 600° C. for 4 hours to remove unreacted carbon black by the burning, thereby obtaining pale green β-silicon carbide whiskers for each of the cases.

Table 1 shows the yield of the resultant silicon carbide whiskers, amount of granular materials, and the diameter and length. As can be seen from the result, by using carbon black having predetermined properties in accordance with the process of the present invention, it was possible to obtain silicon carbide whiskers of high acicularity at a high yield. On the contrary, according to the comparative example, the granular materials were formed in a great amount, the yield was low, and further, it took a long period of time for burning the unreacted carbon black.

TABLE 1

| | Carbon Black | | | SiC Whisker | | | |
|---|---|---|---|---|---|---|---|
| | BET specific surface area (m²/g) | Average grain size (nm) | Bulk density (g/cm³) | SiC amount (g) | Granular material[1] (%) | Diameter[2] (μm) | Length[2] (μm) |
| A | 265 | 18 | 0.12 | 23.5 | <5 | 0.2-2 | 40-200 |
| B | 254 | 30 | 0.10 | 24.9 | <5 | 0.2-2 | 40-200 |
| C | 220 | 16 | 0.13 | 24.0 | <5 | 0.2-2 | 40-200 |
| D | 135 | 20 | 0.13 | 22.3 | <5 | 0.3-2.5 | 40-200 |
| E | 134 | 22 | 0.18 | 20.9 | <5 | 0.3-2.5 | 40-200 |
| F | 250 | 16 | 0.23 | 20.9 | 20-40 | 0.2-5 | 40-200 |
| G[3] | 100 | 22 | 0.32 | 17.6 | 30-60 | 0.2-5 | 20-200 |
| H[3,4] | 61 | 42 | 0.03 | 23.1 | 40-60 | 0.2-5 | <50 |
| I[3] | 30 | 51 | 0.26 | 19.6 | 30-60 | 0.2-5 | <60 |
| J | 26 | 72 | 0.12 | 18.1 | 20-40 | 0.2-5 | <50 |

Note:
[1] Views at three optional areas were photographed under the electron microscopic observation to estimate the ratio of granular material occupying the screen.
[2] Views at three optional areas were photographed under the electron microscopic observation to estimate average diameter and length of the silicon carbide whisker.
[3] Since the unreacted carbon black could not be completely removed by the burning treatment in air at 600° C. for 4 hours, the treatment was conducted for 8 hours.
[4] Since the bulk density was low, 40 g of the material could not be charged into the reaction vessel and 25 g of the material was charged.

EXAMPLE 5

A tray pusher type heating furnace equipped with a heating zone and a cooling zone shown in FIG. 1 was used as the manufacturing device and silicon carbide whiskers were produced continuously by flowing a hydrogen gas in parallel with the transferring direction of the reaction starting material in the furnace reactor and supplying a cooling nitrogen gas to the cooling zone while setting the temperature in the heating zone at 1,600° C.

That is, carbon-containing starting material with the specific surface area of 250 m²/g, average grain size of 14 nm and bulk density of 0.19 g/cm³ and a small amount of nickel oxide as the catalyst were charged to a reaction vessel. Then, continuous operation was conducted for one month under the condition of heating the starting reaction material in the heating zone in a 95% hydrogen/5% nitrogen atmosphere at a temperature of 1,600° C. for 2 hours, and thereafter, cooling with the nitrogen gas in the cooling zone.

Meanwhile, upon observing the inside of the reactor furnace through a view window formed to the furnace wall of the cooling zone, although deposits were recognized at the furnace wall of the cooling zone, no substantial deposition was recognized in the exhaust gas pipe, and continuous operation could be kept stably.

Further, the thus obtained silicon carbide whiskers contained less than 2% of hydrofluoric acid-soluble component and the shape was acicular at high aspect ratio.

What is claimed is:

1. A process for producing silicon carbide whiskers by heating molded silicon/containing starting material and carbon/containing starting material in a reaction vessel, the process comprising placing a powdery carbon/containing starting material around a molded silicon/containing starting material raising the temperature in the vessel to a temperature at which the carbon/containing starting material reacts with the molded silicon/containing starting material, and maintaining the concentration of hydrogen in the vessel at at least 70%.

2. A process for producing silicon carbide whiskers as defined in claim 1, wherein the molded silicon-containing starting material and the carbon-containing starting material are heated to a temperature from 1,400 to 1,700° C.

3. A process for producing silicon carbide whiskers as defined in claim 1, wherein the molded silicon-containing starting material and the carbon-containing starting material are heated under the presence of a catalyst.

4. A process for producing silicon carbide whiskers as defined in any one of claims 1, wherein the molded silicon-containing starting material and the carbon/containing starting material are heated under the presence of a catalyst and a reaction promoter.

5. A process for producing silicon carbide whiskers as defined in claim 1, wherein silicon carbide whiskers are continuously produced by heating the molded silicon containing starting material, the carbon containing starting material and a reaction catalyst in a furnace reactor to said reaction temperature in a non-oxidizing gas atmosphere while transporting them, and cooling by-product vapors forcibly in a cooling zone disposed at the exit of the furnace reactor to deposit them and to collect the deposit.

6. A process for producing silicon carbide whiskers as defined in claim 1, wherein the silicon carbide whiskers formed are further heated to a temperature lower than 700° C. thereby burning to remove unreacted carbon.

7. A process for producing silicon carbide whiskers as defined in claim 1, wherein the molded silicon-containing starting material is a granular molded shape.

8. A process for producing silicon carbide whiskers as defined in claim 1, wherein the molded silicon-containing starting material contains silicon dioxide.

9. A process for producing silicon carbide whiskers as defined in claim 8, wherein the molded silicon-containing starting material has a molded shape prepared by mixing and molding a silicon dioxide powder and a metal silicon powder.

10. A process for producing silicon carbide whiskers as defined in claim 9, wherein the molded shape of the powdery silicon dioxide and the powdery metal silicon comprise silicon dioxide and metal silicon within a range from 0.5:1 to 10:1 in molar ratio.

11. A process for producing silicon carbide whiskers as defined in claim 1, wherein the powdery carbon starting material comprises carbon black or powdery activated carbon.

12. A process for producing silicon carbide whiskers as defined in claim 1, wherein the carbon black has physical properties of more than 100 $m^2/g$ of BET specific surface area, less than 35 nm of average grain size and from 0.06 to 0.2 $g/cm^3$ of bulk density.

* * * * *

UNITED STATES PATENT AND TRADEMARK OFFICE
CERTIFICATE OF CORRECTION

PATENT NO. : 4,873,070

DATED : Oct. 10, 1989

INVENTOR(S) : Kichiro Kaji, et al

It is certified that error appears in the above-identified patent and that said Letters Patent is hereby corrected as shown below:

Title Page:

The Assignee is incorrect, "Kabushiki Kaisha Kobe Seiko Sho, Kobe, Japan", should be:

--Kabushiki Kaisha Kobe Seiko Sho, Kobe, Japan; Kanebo Ltd., Tokyo, Japan--

The order of the inventor's names is incorrectly recorded, "Kichiro Kaji; Katsunori Shimasaki, both of Kobe; Masakazu Yamamoto, Ikeda; Kozo Saiki; Keita Yura, both of Kobe; Hidetsugu Habata, Osaka, Isao Kimura, Suita; Tetsuo Suzuki, Kobe, all of Japan", should be:

--Kichiro Kaji; Katsunori Shimasaki, both of Kobe; Masakazu Yamamoto, Ikeda; Kozo Saiki; Keita Yura, both of Kobe; Tetsuo Suzuki, Kobe; Hidetsugu Habata, Osaka; Isao Kimura, Suita, all of Japan--

Signed and Sealed this

Twenty-seventh Day of November, 1990

Attest:

HARRY F. MANBECK, JR.

*Attesting Officer*  *Commissioner of Patents and Trademarks*